United States Patent
Cheng et al.

(10) Patent No.: US 8,421,156 B2
(45) Date of Patent: Apr. 16, 2013

(54) FET WITH SELF-ALIGNED BACK GATE

(75) Inventors: Kangguo Cheng, Guilderland, NY (US); Bruce Doris, Brewster, NY (US); Ali Khakifirooz, Slingerlands, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 12/823,798

(22) Filed: Jun. 25, 2010

(65) Prior Publication Data

US 2011/0316083 A1   Dec. 29, 2011

(51) Int. Cl.
*H01L 29/66* (2006.01)
*H01L 29/78* (2006.01)
*H01L 21/336* (2006.01)

(52) U.S. Cl.
USPC ............ 257/366; 257/365; 257/E29.264; 257/E21.421; 438/283

(58) Field of Classification Search ............ 257/365, 257/366, E29.264, E21.421; 438/283
See application file for complete search history.

(56) References Cited

U.S. PATENT DOCUMENTS

| | | | | |
|---|---|---|---|---|
| 6,043,535 A * | 3/2000 | Houston | | 257/345 |
| 6,306,691 B1 | 10/2001 | Koh | | |
| 6,580,132 B1 * | 6/2003 | Chan et al. | | 257/365 |
| 6,686,630 B2 * | 2/2004 | Hanafi et al. | | 257/366 |
| 6,897,531 B2 * | 5/2005 | Ohsawa | | 257/366 |
| 7,018,873 B2 | 3/2006 | Dennard et al. | | |
| 2002/0105039 A1 * | 8/2002 | Hanafi et al. | | 257/401 |
| 2003/0178622 A1 | 9/2003 | Wei et al. | | |
| 2003/0178678 A1 * | 9/2003 | Wei et al. | | 257/347 |
| 2005/0087804 A1 * | 4/2005 | Furukawa | | 257/347 |
| 2011/0171792 A1 * | 7/2011 | Chang et al. | | 438/157 |

FOREIGN PATENT DOCUMENTS

| | | | | |
|---|---|---|---|---|
| EP | 0749165 A2 | 12/1996 | | |
| WO | WO 03/083934 | * 10/2003 | | 21/762 |
| WO | WO03083934 A1 | 10/2003 | | |

OTHER PUBLICATIONS

Fenouillet-Beranger et al., Impact of a 10nm Ultra-Thin Box (UTBOX) and Ground Plane on FDSOI devices for 32nm node and below, 2009, IEEE.
Morita et al., Smallest Vth Variability Achieved by Intrinsic Silicon on Thin BOX (SOTB) CMOS with Single Metal Gate, Symposium on VLSI Technology Digest of Technical Papers, 2008, pp. 166-167, IEEE.
International Search Report and Written Opinion; International Application No. PCT/EP2011/060124; International Filing Date: Jun. 17, 2011; Date of Mailing: Aug. 25, 2011; 12 pages.

* cited by examiner

*Primary Examiner* — Victor A Mandala
(74) *Attorney, Agent, or Firm* — Cantor Colburn LLP; Vazken Alexanian

(57) ABSTRACT

A back-gated field effect transistor (FET) includes a substrate, the substrate comprising top semiconductor layer on top of a buried dielectric layer on top of a bottom semiconductor layer; a front gate located on the top semiconductor layer; a channel region located in the top semiconductor layer under the front gate; a source region located in the top semiconductor layer on a side of the channel region, and a drain region located in the top semiconductor layer on the side of the channel region opposite the source regions; and a back gate located in the bottom semiconductor layer, the back gate configured such that the back gate abuts the buried dielectric layer underneath the channel region, and is separated from the buried dielectric layer by a separation distance underneath the source region and the drain region.

20 Claims, 12 Drawing Sheets

FET WITH SELF-ALIGNED BACK GATE

FIELD

This disclosure relates generally to the field of field effect transistor (FET) fabrication, and more specifically to formation of a FET having a back gate.

DESCRIPTION OF RELATED ART

In order to be able to make integrated circuits (ICs), such as memory, logic, and other devices, of a higher integration density than is currently feasible, field effect transistor (FET) dimensions must be scaled down, as FETs are an important component of many ICs. However, as FET dimensions are scaled down, FETs may suffer from various problems. In particular, interactions between the source and drain of the FET may degrade the ability to control whether the FET is on or off, which may result in memory or logic errors during IC operation. As the FET size is reduced, the distance between source and drain regions of the FET is decreased, leading to increased interaction with the channel by the source and drain, and reduced gate control of the channel. This phenomenon is referred to as the short channel effect. It becomes increasingly more difficult to control short channel effects by conventional techniques as FETs become smaller.

An evolution beyond the standard FET with a single top gate that controls the FET channel, is the double-gated FET, wherein the channel is confined between a top and a bottom gate. Positioning the channel between a top and a bottom gate allows for control of the channel by the two gates from both sides of the channel, reducing short channel effects. Further, a double-gated FET may exhibit higher transconductance and reduced parasitic capacitance as compared to a single-gated FET. The presence of the back gate allows enhanced for on-chip power management and device tuning. Multiple threshold voltage (Vt) devices may also be achieved on a single IC chip by applying different back biases at the back gates of various devices. However, the back gate may be formed as a flat layer located underneath both the FET channel and source/drain regions at a uniform depth. This proximity of the back gate to the FET source and drain regions may cause unwanted parasitic capacitance between the source/drain regions and the back gate of a double-gated FET.

SUMMARY

In one aspect, a back-gated field effect transistor (FET) includes a substrate, the substrate comprising top semiconductor layer on top of a buried dielectric layer on top of a bottom semiconductor layer; a front gate located on the top semiconductor layer; a channel region located in the top semiconductor layer under the front gate; a source region located in the top semiconductor layer on a side of the channel region, and a drain region located in the top semiconductor layer on the side of the channel region opposite the source regions; and a back gate located in the bottom semiconductor layer, the back gate configured such that the back gate abuts the buried dielectric layer underneath the channel region, and is separated from the buried dielectric layer by a separation distance underneath the source region and the drain region.

In one aspect, a method of forming a back-gated FET includes forming a first ground plate in a bottom semiconductor layer of a substrate, the substrate comprising a top semiconductor layer on top of a buried dielectric layer on top of a bottom semiconductor layer; forming a dummy gate over the top semiconductor layer; forming a channel region in the top semiconductor layer; forming a source region located in the top semiconductor layer on a side of the channel region, and forming a drain region located in the top semiconductor layer on the side of the channel region opposite the source regions; forming a top dielectric layer over the source and drain regions; removing the dummy gate to form a gate opening; implanting with dopants a portion of the bottom semiconductor layer located underneath the channel region through the gate opening; annealing the implanted portion of the bottom semiconductor layer to form a second ground plate, wherein the first and second ground plate together form a back gate of the FET; and forming a front gate in the gate opening.

In one aspect, a method of forming a back-gated FET includes forming a channel region in a top semiconductor layer of a substrate, the substrate comprising a top semiconductor layer on top of a buried dielectric layer on top of a bottom semiconductor layer; forming a source region located in the top semiconductor layer on a side of the channel region, and forming a drain region located in the top semiconductor layer on the side of the channel region opposite the source regions; forming a front gate over the channel region on the top semiconductor layer; implanting with dopants a portion of the bottom semiconductor layer through the front gate, channel region, and source and drain regions; and annealing the implanted portion of the bottom semiconductor layer to form a back gate of the FET.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a FET with a self-aligned back gate, and a method of forming a FET with a self-aligned back gate, are provided, with exemplary embodiments being discussed below in detail. A FET device having a front gate and a back gate that is self-aligned to the front gate may be fabricated in a bottom semiconductor layer of an extremely thin silicon-on-insulator (ETSOI) substrate having a thin buried insulating (dielectric) layer over a bottom semiconductor layer. The back gate may be formed by implantation in the bottom semiconductor layer, and shaped such that the back gate abuts the thin buried dielectric layer underneath the channel region of the FET, allowing control of the channel region by the back gate, while being located deeper in the bottom silicon under the source/drain regions, thereby reducing parasitic capacitance between the source/drain regions and the back gate. A FET with a self-aligned back gate may be formed by either a gate-last method, in which the FET front gate is formed after an activation anneal of the device (discussed below with respect to FIGS. 1-6), or a gate-first method, in which the FET front gate is formed before the activation anneal (discussed below with respect to FIGS. 7-12).

Figure 1:
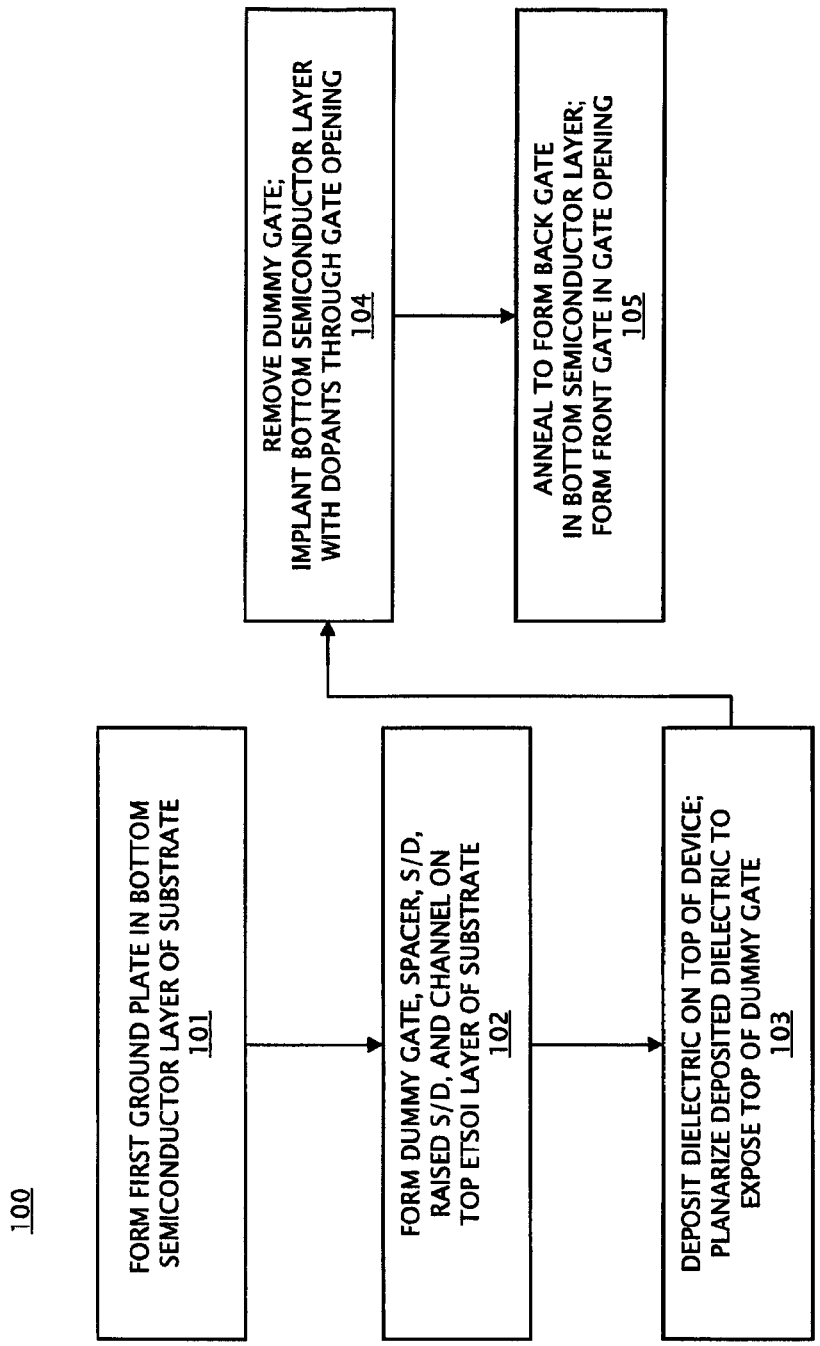
FIG. 1 illustrates an embodiment of a gate-last method of forming a FET with a self-aligned back gate.
Figure 2:
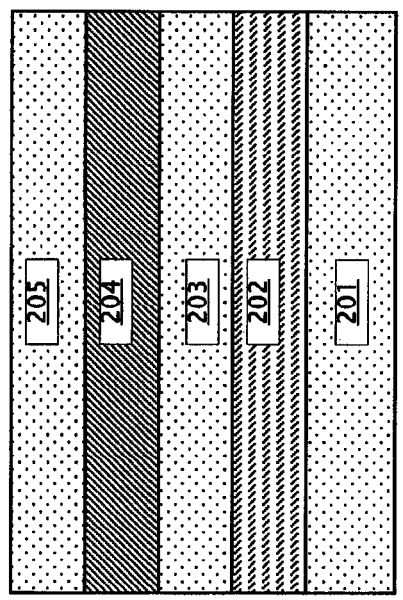
FIG. 2 illustrates an embodiment of an extremely thin silicon-on-insulator (ETSOI) substrate after formation of a ground plate.

FIG. 1 illustrates an embodiment of a gate-last method 100 of forming a FET with a self-aligned back gate. FIG. 1 is discussed with reference to FIGS. 2-6. In block 101, a first ground plate 202 is formed in a bottom semiconductor layer (201 and 203) of ETSOI substrate 200, as shown in FIG. 2. Substrate 200 comprises bottom semiconductor layer 201/203, thin buried dielectric layer 204 (e.g., buried oxide), and ETSOI layer 205, which comprises a top semiconductor layer. First ground plate 202 comprises a layer of doped semiconductor; the dopants used to form ground plate 202 may comprise any appropriate n-type or p-type dopants, including but not limited to arsenic (As), boron (B), phosphorus (P), or indium (In). The first ground plate 202 may be formed either during fabrication of substrate 200, or by implanting the bottom semiconductor layer 201/203 of substrate 200 with dopants after fabrication of substrate 200. Thin buried dielectric layer 204 may be between about 10 nanometers (nm) to about 30 nm thick in some embodiments; thin buried dielectric layer 204 may also be greater than 30 nm or less than 10 nm thick in other embodiments.

The ETSOI layer 205 may comprise any semiconducting material including, but not limited to: silicon (Si), strained Si, silicon carbide (SiC), silicon germanium (SiGe), silicon germanium carbon (SiGeC), Si alloys, germanium (Ge), Ge alloys, gallium arsenide (GaAs), indium arsenide (InAs), and indium phosphide (InP), or any combination thereof. The ETSOI layer 205 may be thinned to a desired thickness by planarization, grinding, wet etch, dry etch or any combination thereof. In one embodiment, the ETSOI layer 205 may have a thickness ranging from 1.0 nm to 10.0 nm. In another embodiment, the ETSOI layer 205 may have a thickness ranging from 1.0 nm to 5.0 nm. In a further embodiment, the ETSOI layer 205 may have a thickness ranging from 3.0 nm to 8.0 nm. The bottom semiconductor layer 201/203 may comprise a semiconducting material, including but not limited to: Si, strained Si, SiC, SiGe, SiGeC, Si alloys, Ge, Ge alloys, GaAs, InAs, or InP, as well as other III/V and II/VI compound semiconductors. The thin buried dielectric layer 204 may be formed by implanting a high-energy dopant into the substrate 200, and then annealing the structure to form the buried dielectric layer 204. In another embodiment, the thin buried dielectric layer 204 may be deposited or grown on bottom semiconductor layer 201/203 prior to the formation of the ETSOI layer 205. In yet another embodiment, the substrate 200 may be formed using wafer-bonding techniques, where a bonded wafer pair is formed utilizing glue, adhesive polymer, or direct bonding.

Figure 3:
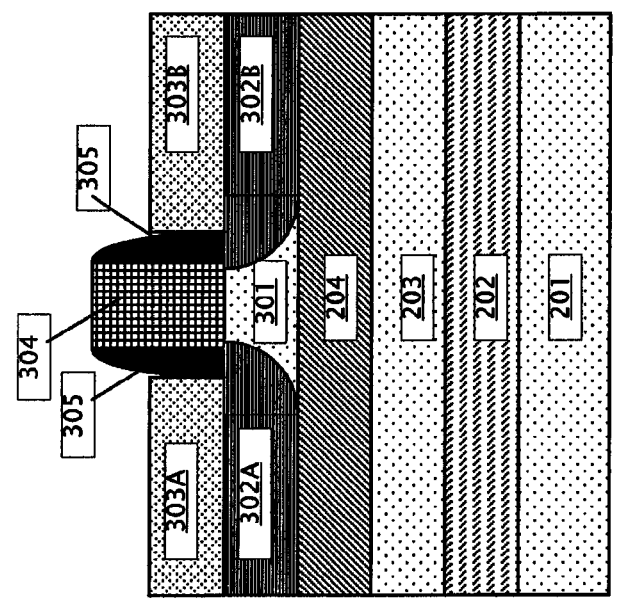
FIG. 3 illustrates an embodiment of the device of FIG. 2 after formation of a dummy gate, spacer, and raised source/drain regions.

In block 102, a channel 301, source/drain regions 302A-B, raised source/drain (RSD) regions 303A-B, dummy gate 304, and spacer 305 are formed on the device 200 of FIG. 2, resulting in device 300 as shown in FIG. 3. Channel 301 and source/drain regions 302A-B are formed from ETSOI layer 205. Channel region 301 may comprise undoped semiconductor, and source/drain regions 302A-B may comprise doped semiconductor in some embodiments. Spacer 305 may comprise nitride in some embodiments.

The dummy gate 304 may be formed using deposition, photolithography and selective etch processes. In one embodiment, a gate layer stack is formed on ETSOI layer 205 by depositing at least one dummy gate dielectric layer (e.g., silicon oxide formed by thermal oxidation) on the ETSOI layer 205, and then depositing a second dummy gate layer (e.g., polysilicon or silicon nitride) on the dummy gate dielectric layer. The gate layer stack is then patterned and etched to form the dummy gate 304.

The RSD regions 303A-B may comprise an epitaxially formed material, and have a thickness ranging from 5 nm to 80 nm, as measured from the upper surface of the ETSOI layer 205. In another embodiment, each of the RSD regions 303A-B may have a thickness ranging from 10 nm to 50 nm, as measured from the upper surface of the ETSOI layer 205.

The RSD regions 303A-B may be selectively formed in direct contact with the ETSOI layer. The RSD regions 303A-B may be formed using an epitaxial growth process. As used herein, the terms "epitaxially formed", "epitaxial growth" and/or "epitaxial deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the ETSOI layer 205 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

The RSD regions 303A-B may be provided by selective growth of silicon. The silicon may be single crystal, polycrystalline or amorphous. The RSD regions 303A-B may comprise epitaxial silicon. The RSD regions 303A-B may also be formed by selective growth of germanium. The germanium may be single crystal, polycrystalline or amorphous. In another example, the RSD regions 303A-B may comprise SiGe.

A number of different sources may be used for the selective deposition of silicon. Silicon sources for growth of silicon (epitaxial or polycrystalline) include silicon tetrachloride, dichlorosilane (SiH2Cl2), and silane (SiH4). The temperature for epitaxial silicon deposition typically ranges from 550° C. to 900° C. Higher temperature typically results in faster deposition; the faster deposition may result in crystal defects and film cracking. In one embodiment, the RSD regions 303A-B each have a tapered portion that extends from the sidewall spacers 305.

The RSD regions 303A-B are doped with a dopant having a same conductivity as the underlying source/drain regions 303A-B. For example, and in the embodiments in which the source/drain regions 302A-B are doped to a p-type conductivity, the RSD regions 303A-B are also doped to a p-type conductivity. In the embodiments in which the source/drain regions 302A-B are doped to an n-type conductivity, the RSD regions 303A-B are doped to a n-type conductivity. The dopant may be introduced in-situ during the epitaxial growth process that forms the RSD regions 303A-B. In another embodiment, the dopant may be introduced using ion implantations following the epitaxial growth process that deposits the semiconductor material of the RSD regions 303A-B. Resulting dopant concentrations for the RSD regions 303A-B may range from $2 \times 10^{19}$ dopant atoms per cubic centimeter to $5 \times 10^{21}$ dopant atoms per cubic centimeter in some embodiments.

Figure 4:
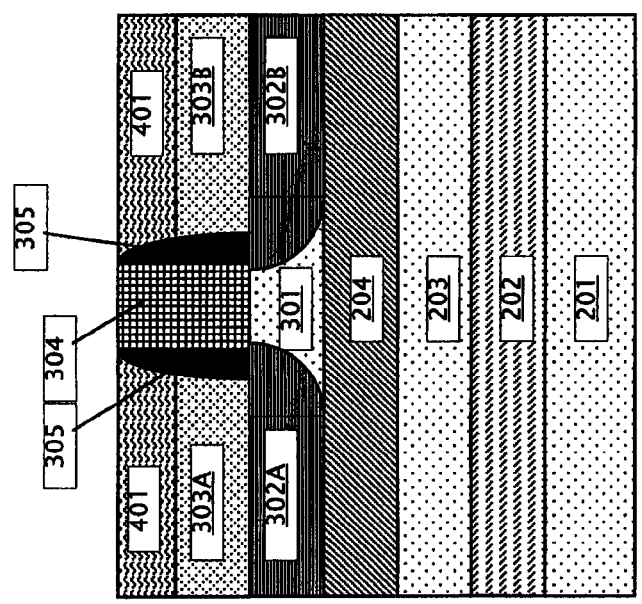
FIG. 4 illustrates an embodiment of the device of FIG. 3 after dielectric deposition and planarization.
Figure 5:
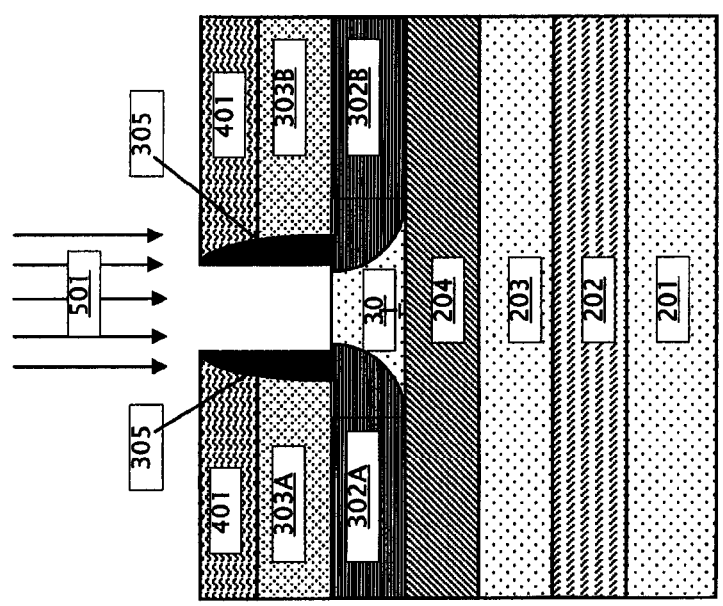
FIG. 5 illustrates an embodiment of the device of FIG. 4 during implantation after removal of the dummy gate.

In block 103, a top dielectric layer 401 (e.g., oxide), as shown in FIG. 4, is formed over the device 300 of FIG. 3. Top dielectric layer 401 is formed by deposition of a dielectric material over the top of device 300, and planarizing the deposited dielectric to expose the top of dummy gate 304. Then, in block 104, dummy gate 304 is removed from device 400 of FIG. 5. Dummy gate 304 may be removed in any appropriate manner that does not damage channel 301, top dielectric layer 401, and spacers 305. Then, silicon layer 203 is implanted with dopants 501 through the gate opening left by the removal of dummy gate 304, as shown in FIG. 5. Dopants 501 may include but are not limited to As, B, P, or In; dopants 501 may be selected to be the same as, or of the same type (n-type or p-type) as the dopants used to form ground plate 202 in block 101. Dopants 501 form an implanted region in silicon layer 203 underneath channel 301. Top dielectric layer 401 prevents the dopants 501 from implanting the portion of silicon 203 located underneath dielectric layer 401, RSD regions 303A-B, and source/drain regions 302A-B.

Figure 6:
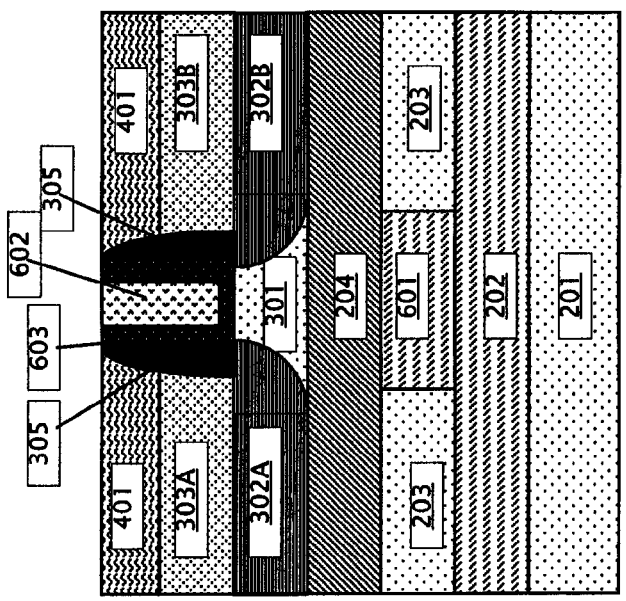
FIG. 6 illustrates an embodiment of the device of FIG. 5 after annealing to form the back gate and formation of the front gate to form a FET with a self-aligned back gate.

In block 105, the device 500 of FIG. 5 is annealed to activate the implanted dopants 501 in silicon layer 203, forming second ground plate 601 as shown in FIG. 6. The anneal may comprise a laser anneal, flash anneal, spike anneal, or any suitable combination of those anneal techniques, in some embodiments. Then, after the anneal of block 105, a front gate comprising gate dielectric layer 603 and gate conducting layer 602 is formed in the gate opening. Device 600 comprises a FET having a self-aligned back gate comprising first ground plate 202, which directly abuts thin buried dielectric layer 204 under channel region 301, and second ground plate 601. Because the portion of the back gate comprising second ground plate 601 is not formed under the source/drain regions 302A-B, FET 600 may have a relatively low parasitic capacitance as compared to a FET device having a flat back gate underneath both the channel and source/drain regions. There may be a separation distance of about 20 nanometers to about 70 nanometers in bottom semiconductor layer 203 between the ground plate 202 portion of the back gate and the bottom of thin buried dielectric layer 204 underneath the source/drain regions 302A-B in some embodiments.

In one embodiment, the gate dielectric layer 603 may include, but is not limited to, an oxide, nitride, oxynitride and/or silicates including metal silicates, aluminates, titanates and nitrides. In one example, when the gate dielectric layer 603 is comprised of an oxide, the oxide may be selected from the group including, but not limited to, SiO2, HfO2, ZrO2, Al2O3, TiO2, La2O3, SrTiO3, LaAlO3, Y2O3 and mixture thereof. In another embodiment, the gate dielectric layer 603 is composed of a nitride, such as silicon nitride. The physical thickness of the gate dielectric layer 603 may vary, but typically, the gate dielectric layer 603 has a thickness ranging from 1 nm to 10 nm. In another embodiment, the gate dielectric layer 603 has a thickness ranging from 1 nm to 3 nm. The gate dielectric layer 603 may be formed using any of several deposition and growth methods, including but not limited to, thermal or plasma oxidation or nitridation methods, chemical vapor deposition methods and physical vapor deposition methods.

The gate conducting layer 602 may be composed of conductive materials including, but not limited to, metals, metal alloys, metal nitrides and metal silicides, as well as laminates thereof and composites thereof. In one embodiment, the gate conducting layer 602 may be any conductive metal including, but not limited to, tungsten (W), nickel (Ni), titanium (Ti), molybdenum (Mo), tantalum (Ta), copper (Cu), platinum (Pt), silver (Ag), gold (Au), ruthenium (Ru), iridium (Ir), rhodium (Rh), and rhenium (Re), and alloys that include at least one of the aforementioned conductive elemental metals. The gate conducting layer 602 may also comprise doped polysilicon and/or polysilicon-germanium alloy materials (i.e., having a dopant concentration from $1 \times 10^{18}$ to $1 \times 10^{22}$ dopant atoms per cubic centimeter) and polycide materials (doped polysilicon/metal silicide stack materials). The gate conducting layer 602 may be composed of the same material or different materials. The gate conducting layer 602 may be formed using a deposition method including, but not limited to, salicide methods, atomic layer deposition methods, chemical vapor deposition methods and physical vapor deposition methods, such as, but not limited to, evaporative methods and sputtering methods. Although the gate conducting layer 602 is depicted in FIG. 6 as being a single layer, embodiments have been contemplated in which the gate conducting layer 602 are each a multi-layered structure of conductive materials.

Figure 7:
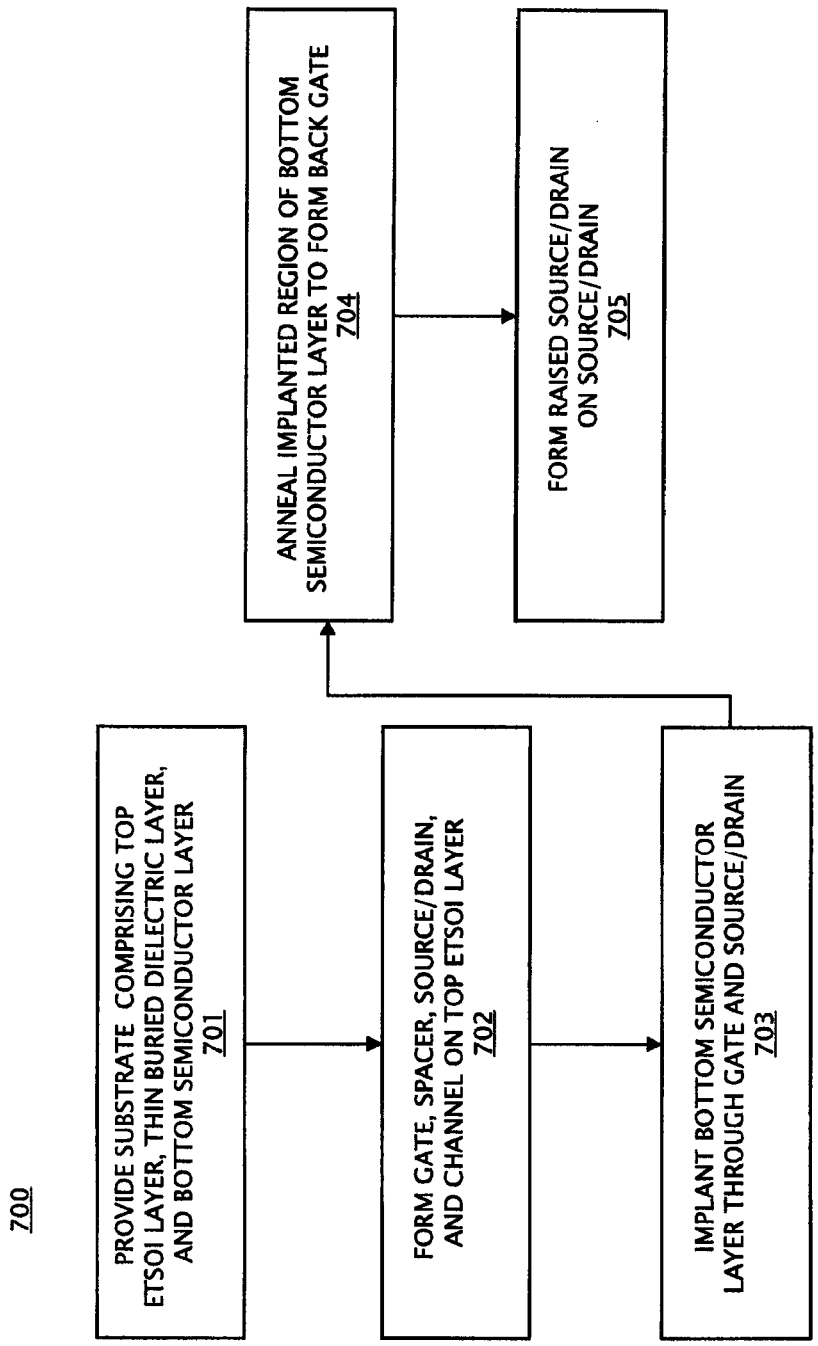
FIG. 7 illustrates an embodiment of a gate-first method of forming a FET with a self-aligned back gate.
Figure 8:
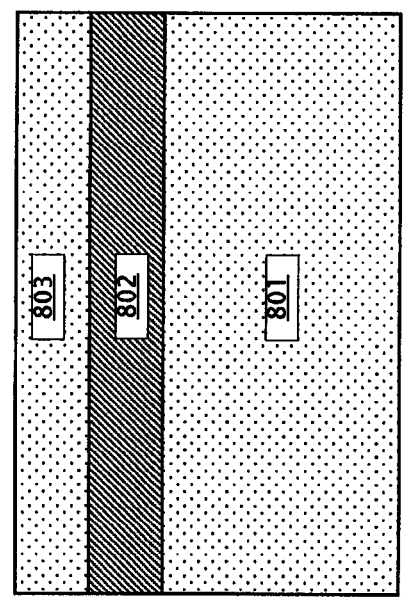
FIG. 8 illustrates an embodiment of an ETSOI substrate.

FIG. 7 illustrates an embodiment of a gate-first method 700 of forming a FET with a self-aligned back gate. FIG. 7 is discussed with reference to FIGS. 8-12. In block 701, a substrate 800 as shown in FIG. 8 is provided, comprising bottom semiconductor layer 801, thin buried dielectric layer 802 (e.g., buried oxide), and ETSOI layer 803, which comprises a top semiconductor layer. Thin buried dielectric layer 802 may be between about 10 nanometers and about 30 nanometers thick in some embodiments.

The ETSOI layer 803 may comprise any semiconducting material including, but not limited to: silicon (Si), strained Si, silicon carbide (SiC), silicon germanium (SiGe), silicon germanium carbon (SiGeC), Si alloys, germanium (Ge), Ge alloys, gallium arsenide (GaAs), indium arsenide (InAs), and indium phosphide (InP), or any combination thereof. The ETSOI layer 803 may be thinned to a desired thickness by planarization, grinding, wet etch, dry etch or any combination thereof. In one embodiment, the ETSOI layer 803 may have a thickness ranging from 1.0 nm to 10.0 nm. In another embodiment, the ETSOI layer 803 may have a thickness ranging from 1.0 nm to 5.0 nm. In a further embodiment, the ETSOI layer 803 may have a thickness ranging from 3.0 nm to 8.0 nm. The bottom semiconductor layer 801 may comprise a semiconducting material, including but not limited to: Si, strained Si, SiC, SiGe, SiGeC, Si alloys, Ge, Ge alloys, GaAs, InAs, or InP, as well as other III/V and II/VI compound semiconductors. The thin buried dielectric layer 802 may be formed by implanting a high-energy dopant into the substrate 800, and then annealing the structure to form the buried dielectric layer 802. In another embodiment, the thin buried dielectric layer 802 may be deposited or grown on bottom semiconductor layer 801 prior to the formation of the ETSOI layer 803. In yet another embodiment, the substrate 800 may be formed using wafer-bonding techniques, where a bonded wafer pair is formed utilizing glue, adhesive polymer, or direct bonding.

Figure 9:
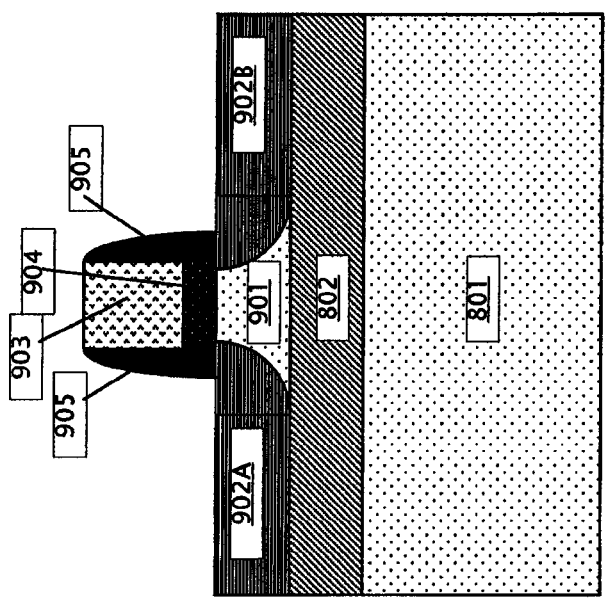
FIG. 9 illustrates an embodiment of the device of FIG. 8 after formation of a gate, spacer, and source/drain regions on the substrate.

In block 702, a channel region 901, source/drain regions 902A-B, a gate comprising gate conducting layer 903 and gate dielectric layer 904, and a spacer 905 are formed on substrate 800, resulting in device 900 as shown in FIG. 9. Channel region 901 and source/drain regions 902A-B are formed in ETSOI layer 803. Channel region 901 may comprise undoped semiconductor, and source/drain regions 902A-B may comprise doped semiconductor in some embodiments. Spacer 905 may comprise nitride in some embodiments. The gate, comprising gate conducting layer 903 and gate dielectric layer 904, may be about 30 nanometers to about 50 nanometers high in some embodiments.

In one embodiment, the gate dielectric layer 904 may include, but is not limited to, an oxide, nitride, oxynitride and/or silicates including metal silicates, aluminates, titanates and nitrides. In one example, when the gate dielectric layer 904 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. In another embodiment, the gate dielectric layer 904 is composed of a nitride, such as silicon nitride. The physical thickness of the gate dielectric layer 904 may vary, but typically, the gate dielectric layer 904 has a thickness ranging from 1 nm to 10 nm. In another embodiment, the gate dielectric layer 904 has a thickness ranging from 1 nm to 3 nm. The gate dielectric layer 904 may be formed using any of several deposition and growth methods, including but not limited to, thermal or plasma oxidation or nitridation methods, chemical vapor deposition methods and physical vapor deposition methods.

The gate conducting layer 903 may be composed of conductive materials including, but not limited to, metals, metal alloys, metal nitrides and metal silicides, as well as laminates thereof and composites thereof. In one embodiment, the gate conducting layer 903 may be any conductive metal including, but not limited to, tungsten (W), nickel (Ni), titanium (Ti), molybdenum (Mo), tantalum (Ta), copper (Cu), platinum (Pt), silver (Ag), gold (Au), ruthenium (Ru), iridium (Ir), rhodium (Rh), and rhenium (Re), and alloys that include at least one of the aforementioned conductive elemental metals. The gate conducting layer 903 may also comprise doped polysilicon and/or polysilicon-germanium alloy materials (i.e., having a dopant concentration from $1 \times 10^{18}$ to $1 \times 10^{22}$ dopant atoms per cubic centimeter) and polycide materials (doped polysilicon/metal silicide stack materials). The gate conducting layer 903 may be composed of the same material or different materials. The gate conducting layer 903 may be formed using a deposition method including, but not limited to, salicide methods, atomic layer deposition methods, chemical vapor deposition methods and physical vapor deposition methods, such as, but not limited to, evaporative methods and sputtering methods. Although the gate conducting layer 903 is depicted in FIGS. 9-12 as being a single layer, embodiments have been contemplated in which the gate conducting layer 903 are each a multi-layered structure of conductive materials.

Figure 10:
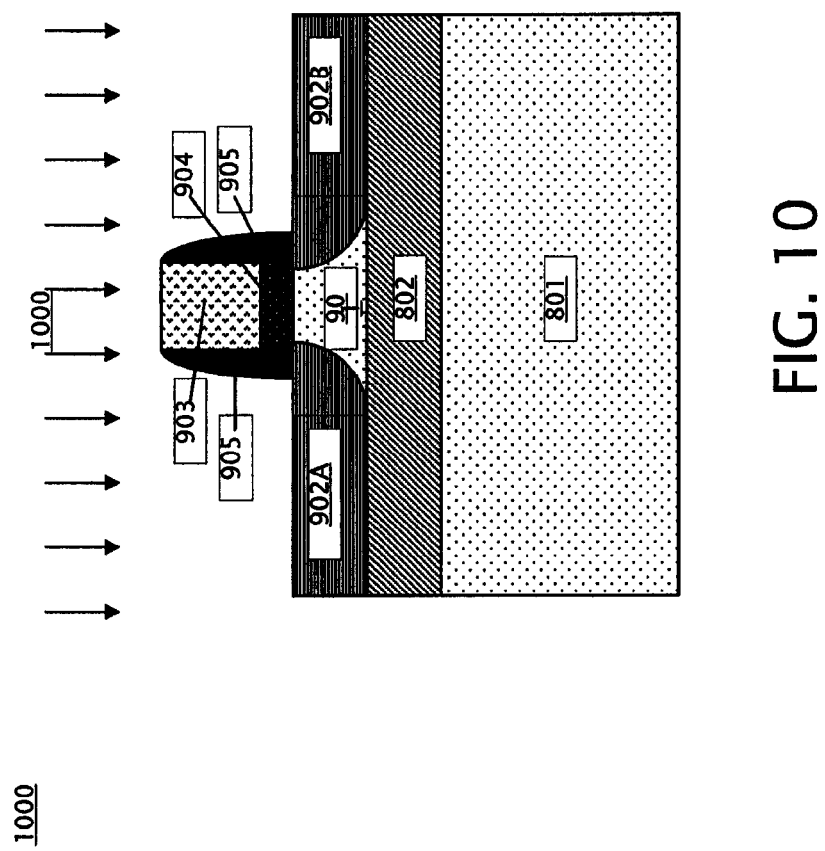
FIG. 10 illustrates an embodiment of the device of FIG. 9 during implantation.
Figure 11:
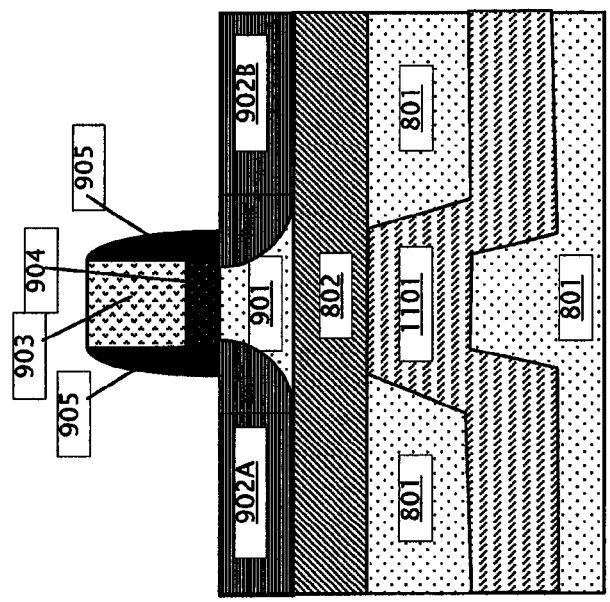
FIG. 11 illustrates an embodiment of the device of FIG. 10 after annealing to form the self-aligned back gate.
Figure 12:
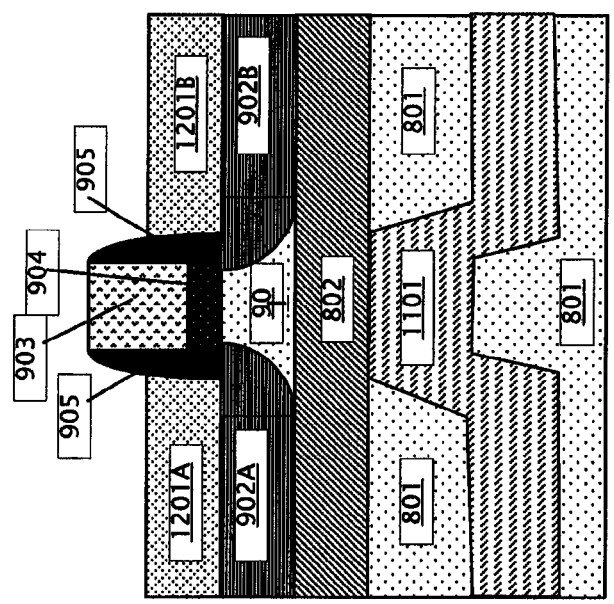
FIG. 12 illustrates an embodiment of the device of FIG. 11 after formation of raised source and drain regions to form a FET with a self-aligned back gate.

In block 703, the device 900 of FIG. 9 is implanted with dopants 1001 as shown in FIG. 10. Dopants 1001 form an implanted region in bottom semiconductor layer 801. Dopants 1001 may include but are not limited to arsenic (As), boron (B), phosphorus (P), or indium (In); the type of dopants used for dopants 1001 are selected based on whether the finished FET is n-type or p-type. Dopants 1001 are driven deeper into in bottom semiconductor layer 801 under source/drain regions 902A-B than under the gate (comprising gate conducting layer 903 and gate dielectric layer 904) because of the difference in height between source/drain regions 902A-B and the gate.

In block 704, the implanted device 1000 of FIG. 10 is annealed to form back gate 1101 in bottom semiconductor layer 801. The stair-step shape of back gate 1101 is due to the difference in implantation depth under the source/drain regions 902A-B versus under the gate comprising gate conducting layer 903 and gate dielectric layer in block 703. In block 705, RSD regions 1201A-B are formed on source/drain regions 902A-B, resulting in FET 1200 with self aligned back gate 1101. RSD regions 1201A-B may be formed using any of the materials and techniques discussed above with respect to RSD regions 303A-B. Because the back gate 1101 is farther away from the source/drain regions 902A-B, there is reduced parasitic capacitance between source/drain regions 902A-B and back gate 1101 as compared to a FET device having a flat back gate underneath the channel and source/drain regions. There may be a separation distance of about 20 nanometers to about 70 nanometers in bottom semiconductor layer 801 between the back gate 1101 and the bottom of buried dielectric layer 802 underneath the source/drain regions 902A-B in some embodiments; this separation distance may vary with the height of the gate comprising gate conducting layer 903 and gate dielectric layer 904.

The technical effects and benefits of exemplary embodiments include formation of a FET device having a back gate that is self-aligned to the front gate by implantation.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A back-gated field effect transistor (FET), comprising:
   a substrate, the substrate comprising a top semiconductor layer on top of a buried dielectric layer on top of a bottom semiconductor layer;
   a front gate located on the top semiconductor layer;
   a channel region located in the top semiconductor layer under the front gate;

a source region located in the top semiconductor layer on a side of the channel region, and a drain region located in the top semiconductor layer on the side of the channel region opposite the source regions; and a back gate located in the bottom semiconductor layer, the back gate configured such that a top surface of the back gate abuts the buried dielectric layer underneath the channel region, and the top surface of the back gate is separated from the buried dielectric layer by a separation distance underneath the source region and the drain region.

2. The FET of claim 1, wherein the back gate comprises a region of silicon doped with at least one of arsenic (As), boron (B), phosphorus (P), and indium (In).

3. The FET of claim 1, wherein the separation distance is at least about 20 nanometers.

4. The FET of claim 1, wherein the front gate comprises a gate dielectric layer and a gate conducting layer.

5. The FET of claim 1, further comprising raised source and drain regions located over the source and drain regions, and a spacer comprising nitride located adjacent to the front gate on the top semiconductor layer.

6. The FET of claim 1, wherein the buried dielectric layer is between about 10 nanometers and about 30 nanometers thick.

7. A method of forming a back-gated FET, comprising:
forming a first ground plate in a bottom semiconductor layer of a substrate, the substrate comprising a top semiconductor layer on top of a buried dielectric layer on top of a bottom semiconductor layer;
forming a dummy gate over the top semiconductor layer;
forming a channel region in the top semiconductor layer;
forming a source region located in the top semiconductor layer on a side of the channel region, and forming a drain region located in the top semiconductor layer on the side of the channel region opposite the source regions;
forming a top dielectric layer over the source and drain regions;
removing the dummy gate to form a gate opening;
implanting with dopants a portion of the bottom semiconductor layer located underneath the channel region through the gate opening;
annealing the implanted portion of the bottom semiconductor layer to form a second ground plate, wherein the first and second ground plate together form a back gate of the FET; and
forming a front gate in the gate opening.

8. The method of claim 7, wherein the first ground plate and the second ground plate comprise silicon doped with at least one of arsenic (As), boron (B), phosphorus (P), and indium (In).

9. The method of claim 7, wherein the first ground plate is formed by implanting the bottom semiconductor layer after formation of the substrate.

10. The method of claim 7, wherein the first ground plate is formed during fabrication of the substrate.

11. The method of claim 7, wherein the second ground plate abuts the buried dielectric layer underneath the channel region, and the first ground plate is separated from the buried dielectric layer by a separation distance of at least 20 nanometers underneath the source region and the drain region.

12. The method of claim 7, further comprising forming a spacer comprising nitride adjacent to the gate on the top semiconductor layer.

13. The method of claim 7, wherein the front gate comprises a gate dielectric layer and a gate conducting layer.

14. The method of claim 7, further comprising forming raised source and drain regions over the source and drain regions before formation of the top dielectric layer over the source and drain.

15. A method of forming a back-gated FET, comprising:
forming a channel region in a top semiconductor layer of a substrate, the substrate comprising a top semiconductor layer on top of a buried dielectric layer on top of a bottom semiconductor layer;
forming a source region located in the top semiconductor layer on a side of the channel region, and forming a drain region located in the top semiconductor layer on the side of the channel region opposite the source regions;
forming a front gate over the channel region on the top semiconductor layer;
implanting with dopants a portion of the bottom semiconductor layer through the front gate, channel region, and source and drain regions; and
annealing the implanted portion of the bottom semiconductor layer to form a back gate of the FET, wherein a top surface of the back gate abuts the buried dielectric layer underneath the channel region, and the top surface of the back gate is separated from the buried dielectric layer by a separation distance underneath the source region and the drain region.

16. The method of claim 15, wherein the back gate comprises silicon doped with at least one of arsenic (As), boron (B), phosphorus (P), and indium (In).

17. The method of claim 15, wherein the back gate abuts the buried dielectric layer underneath the channel region, and is separated from the buried dielectric layer by a separation distance of at least 20 nanometers underneath the source region and the drain region.

18. The method of claim 15, further comprising forming a spacer comprising nitride adjacent to the gate on the top semiconductor layer.

19. The method of claim 15, wherein the front gate comprises a gate dielectric layer and a gate conducting layer.

20. The method of claim 15, further comprising forming raised source and drain regions over the source and drain regions before the implanting with dopants.

* * * * *